United States Patent
Buchberger, Jr.

(10) Patent No.: US 9,916,967 B2
(45) Date of Patent: Mar. 13, 2018

(54) FAST RESPONSE FLUID CONTROL SYSTEM

(71) Applicant: APPLIED MATERIALS, INC., Santa Clara, CA (US)

(72) Inventor: Douglas A. Buchberger, Jr., Livermore, CA (US)

(73) Assignee: Applied Materials, Inc., Santa Clara, CA (US)

(*) Notice: Subject to any disclaimer, the term of this patent is extended or adjusted under 35 U.S.C. 154(b) by 811 days.

(21) Appl. No.: 14/198,309

(22) Filed: Mar. 5, 2014

(65) Prior Publication Data

US 2014/0262030 A1 Sep. 18, 2014

Related U.S. Application Data

(60) Provisional application No. 61/779,188, filed on Mar. 13, 2013.

(51) Int. Cl.
C03C 25/68 (2006.01)
H01J 37/32 (2006.01)
H01L 21/67 (2006.01)

(52) U.S. Cl.
CPC .. H01J 37/32724 (2013.01); H01J 37/32522 (2013.01); H01L 21/67248 (2013.01)

(58) Field of Classification Search
CPC ......... H01J 37/32724; H01L 21/67248; H01L 21/67103
USPC .............................. 216/67, 71; 438/714, 715
See application file for complete search history.

(56) References Cited

U.S. PATENT DOCUMENTS

| 2009/0044752 A1* | 2/2009 | Furuya | C23C 16/45572 118/723 E |
| 2010/0140221 A1* | 6/2010 | Kikuchi | H01J 37/32091 216/67 |
| 2013/0240144 A1* | 9/2013 | Buchberger | H01J 37/32522 156/345.27 |
| 2014/0262199 A1* | 9/2014 | Kobayashi | G05D 23/1934 165/294 |

FOREIGN PATENT DOCUMENTS

WO WO 2013073537 A1 * 5/2013 ......... G05D 23/1934

* cited by examiner

Primary Examiner — Binh X Tran
(74) Attorney, Agent, or Firm — Schwabe, Williamson & Wyatt, P.C.

(57) ABSTRACT

A plasma processing apparatus and method to control a temperature of a chamber component therein are described. A process chamber may include a temperature controlled chamber component and at least one remote heat transfer fluid loop comprising a first heat exchanger having a primary side in fluid communication with a heat sink or heat source, and a local heat transfer fluid loop placing the chamber component in fluid communication with a secondary side of the first heat exchanger. The local loop may be of significantly smaller fluid volume than the remote loop(s) and circulated to provide thermal load of uniform temperature. Temperature control of heat transfer fluid in the local loop and temperature control of the chamber component may be implemented with a cascaded control algorithm. The plasma processing apparatus further includes an AC heated electrostatic chuck (ESC) assembly.

12 Claims, 12 Drawing Sheets

FAST RESPONSE FLUID CONTROL SYSTEM

CROSS-REFERENCE TO RELATED APPLICATIONS

This application claims the benefit of U.S. Provisional Application No. 61/779,188, filed on Mar. 13, 2013, the entire contents of which are hereby incorporated by reference herein.

TECHNICAL FIELD

Embodiments of the present invention generally relate to plasma processing equipment, and more particularly to methods of controlling chamber component temperatures during processing of a workpiece with a plasma processing chamber.

BACKGROUND

In a plasma processing chamber, such as a plasma etch or plasma deposition chamber, the temperature of a chamber component is often an important parameter to control during a process. For example, a temperature of a substrate holder, commonly called a chuck or pedestal, may be controlled to heat/cool a workpiece to various controlled temperatures during the process recipe (e.g., to control an etch rate). Similarly, a temperature of a showerhead/upper electrode, chamber liner, baffle, process kit, or other component may also be controlled during the process recipe to influence the processing. Conventionally, a heat sink and/or heat source is coupled to the processing chamber to maintain the temperature of a chamber component at a desired temperature. Often, at least one heat transfer fluid loop thermally coupled to the chamber component is utilized to provide heating and/or cooling power.

Long line lengths in a heat transfer fluid loop, and the large heat transfer fluid volumes associated with such long line lengths are detrimental to temperature control response times. Point-of-use systems are one means to reduce fluid loop lengths/volumes. However, physical space constraints disadvantageously limit the power loads of such point-of-use systems.

With plasma processing trends continuing to increase RF power levels and also increase workpiece diameters (with 300 mm now typical and 450 mm systems now under development), a temperature control system capable of both a fast response time and high power loads is advantageous in the plasma processing field.

SUMMARY

One or more embodiments are directed to methods of controlling chamber component temperatures during processing of a workpiece with a plasma processing chamber.

In an embodiment, a plasma processing apparatus includes a process chamber having a temperature controlled component. A first heat transfer fluid loop having a first heat exchanger having a primary side in fluid communication with a heat sink is also included. The apparatus also includes a second heat transfer fluid loop placing the temperature controlled component in fluid communication with a secondary side of the first heat exchanger, wherein the second heat transfer loop further includes an inline heater or a second heat exchanger disposed in parallel with the first heat exchanger to thermally couple the temperature controlled component to a heat source. A pump is included to circulate a heat transfer fluid through the second heat transfer loop. At least one mixing valve is included and is disposed in the second heat transfer loop to apportion heat transfer fluid flow between the first heat exchanger, and the inline heater, or the second heat exchanger. The apparatus also includes an AC heated electrostatic chuck (ESC) assembly.

In an embodiment, a plasma processing apparatus includes a process chamber including a temperature controlled component, a first heat transfer fluid loop having a first heat exchanger having a primary side in fluid communication with a heat sink, a second heat transfer fluid loop having a second exchanger having a primary side in fluid communication with a heat source, and a third heat transfer fluid loop placing the temperature controlled component in parallel fluid communication with secondary sides of both the first and second heat exchangers. The third heat transfer fluid loop further includes a pump disposed between the temperature controlled component and the secondary sides of first and second heat exchangers to circulate a heat transfer liquid through the third heat transfer fluid loop, a bypass disposed between inlet and outlets of the secondary sides of the first and second heat exchangers, and a mixing valve disposed between the temperature controlled component and the secondary sides of the first and second heat exchangers. The bypass is to apportion first heat transfer fluid rates of flow between the first heat exchanger, second heat exchanger, and bypass. The apparatus also includes an AC heated electrostatic chuck (ESC) assembly.

In an embodiment, a method of controlling a temperature of a component in a plasma processing apparatus includes providing a first heat transfer fluid at a first temperature to a first heat exchanger. The method also includes providing a second heat transfer fluid at a second temperature to a second heat exchanger. The method also includes controlling a temperature of a third heat transfer fluid by apportioning a rate of flow of the third heat transfer fluid between the first and second heat exchangers. The method also includes providing the third heat transfer fluid to the component. The method also includes controlling a temperature of an AC heated electrostatic chuck (ESC) assembly.

In an embodiment, a non-transitory machine-accessible storage medium has instructions stored thereon which cause a data processing system to perform a method of controlling a temperature of a component in a plasma processing apparatus, the method including providing a first heat transfer fluid at a first temperature to a first heat exchanger. The method also includes providing a second heat transfer fluid at a second temperature to a second heat exchanger. The method also includes controlling a temperature of a third heat transfer fluid by apportioning a rate of flow of the third heat transfer fluid between the first and second heat exchangers. The method also includes providing the third heat transfer fluid to the component. The method also includes controlling a temperature of an AC heated electrostatic chuck (ESC) assembly.

BRIEF DESCRIPTION OF THE DRAWINGS

Embodiments of the present invention are illustrated by way of example, and not limitation, in the figures of the accompanying drawings in which.

DETAILED DESCRIPTION

In the following description, numerous details are set forth. It will be apparent, however, to one skilled in the art, that the present invention may be practiced without these specific details. In some instances, well-known methods and devices are shown in block diagram form, rather than in detail, to avoid obscuring the present invention. Reference throughout this specification to "an embodiment" means that a particular feature, structure, function, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the two embodiments are not mutually exclusive.

Unless specifically stated otherwise, as apparent from the following discussions, it is appreciated that throughout the specification discussions utilizing terms such as "processing," "computing," "calculating," "determining," or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" my be used to indicated that two or more elements are in either direct or indirect (with other intervening elements between them) physical or electrical contact with each other, and/or that the two or more elements co-operate or interact with each other (e.g., as in a cause an effect relationship).

Figure 1:
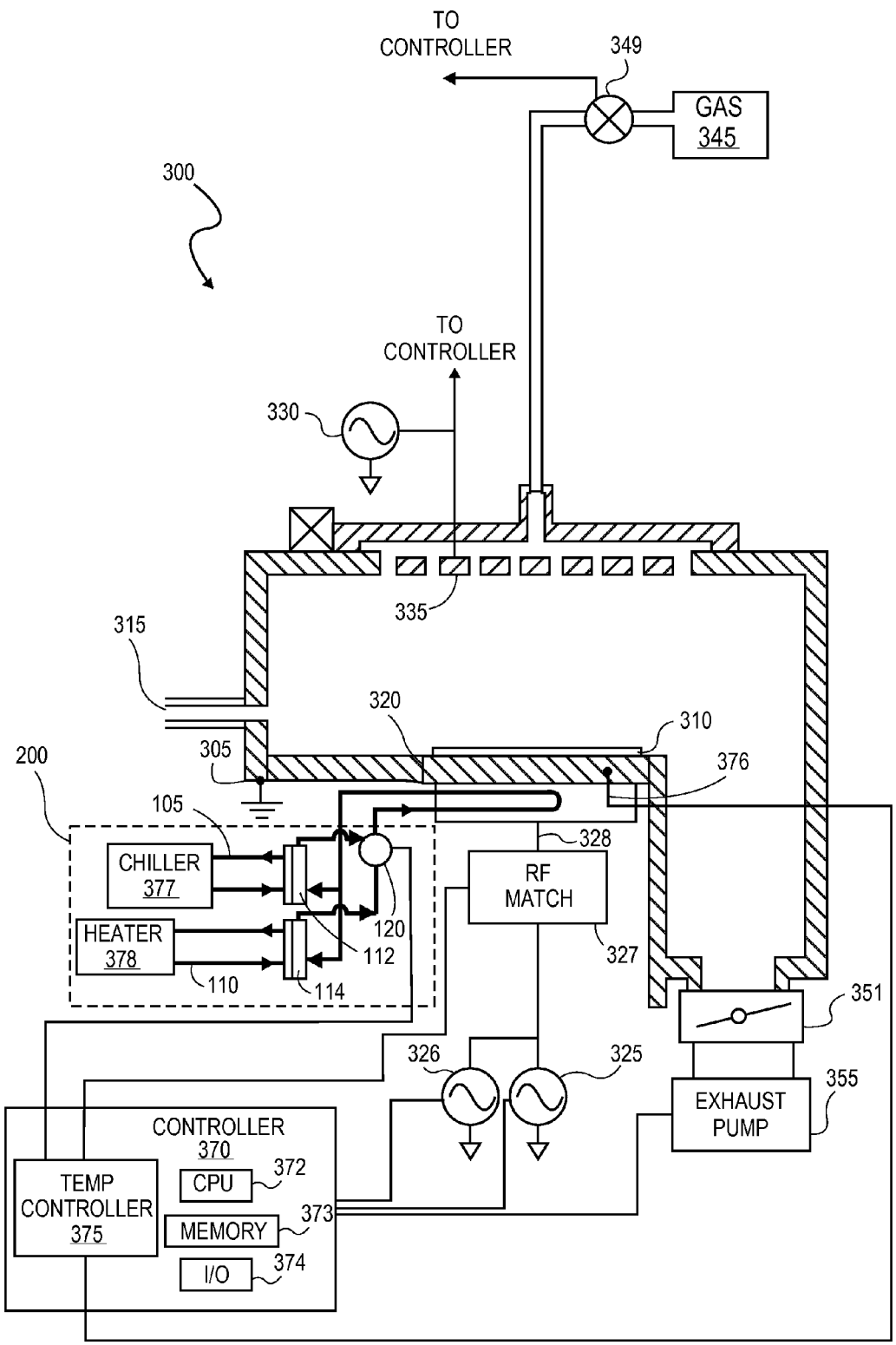
FIG. 1 illustrates a schematic of a plasma etch system including a primary heat transfer fluid loop coupled to heat source and a primary heat transfer fluid loop coupled to a heat sink with a temperature controlled component thermally coupled to the primary loops through a local heat transfer fluid loop, in accordance with an embodiment of the present invention.

FIG. 1 illustrates a cross-sectional schematic view of a plasma processing system 300 which includes a component for which temperature is controlled. The plasma processing system 300 may be any type of processing chamber known in the art, including plasma etch chambers, such as, but not limited to, Enabler™, MxP®, MxP+™, Super-E™, DPS II AdvantEdge™ G3, or E-MAX® chambers manufactured by Applied Materials of CA, USA. Other commercially available etch chambers, as well as other plasma processing systems, such as plasma enhanced chemical vapor deposition (PECVD) systems, and the like, may be similarly controlled.

The plasma processing system 300 includes a grounded chamber 305. A workpiece to be processed (i.e., substrate) 310 is loaded through an opening 315 and clamped to a temperature controlled chuck 320. The substrate 310 may be any workpiece conventionally employed in the plasma processing art and the present invention is not limited in this respect. Furthermore, the dimension of the substrate may vary as known in the industry with conventional silicon substrates currently having a diameter of 300 mm and 450 mm substrates in development. In particular embodiments, temperature controlled chuck 320 includes a plurality of zones, each zone independently controllable to a temperature setpoint which may be the same or different between the zones. For example, the temperature controlled chuck 320 may include both an inner thermal zone proximate a center of substrate 310 and an outer thermal zone proximate to a periphery/edge of substrate 310. Process gases, are supplied from gas source 345 through a mass flow controller 349 to the interior of the chamber 305. Chamber 305 is evacuated via an exhaust valve 351 connected to a high capacity vacuum pump stack 355.

When plasma power is applied to the chamber 305, a plasma is formed in a processing region over substrate 310. A first plasma bias power 325 is coupled to the chuck 320 (e.g., cathode) via transmission line 328 to energize the plasma. The plasma bias power 325 typically has a low frequency between about 2 MHz to 60 MHz, and in a particular embodiment, is in the 13.56 MHz band. In the exemplary embodiment, the plasma processing system 300 includes a second plasma bias power 326 operating at about the 2 MHz band which is connected to the same RF match 327 as plasma bias power 325 to provide a dual frequency bias power. In one dual frequency bias power embodiment for the exemplary 300 mm substrate, a 13.56 MHz generator supplies between 500 W and 10000 W while a 2 MHz generator supplies between 0 and 10000 W of power for a total bias power ($W_{b,tot}$) of between 500 W and 20000 W. In another dual frequency bias power embodiment a 60 MHz generator supplies between 100 W and 8000 W while a 2 MHz generator supplies between 0 and 10000 W of power for a total bias power ($W_{b,tot}$) of between 100 W and 20000 W.

A plasma source power 330 is coupled through a match (not depicted) to a plasma generating element 335 (e.g., showerhead) which may be anodic relative to the chuck 320 to provide high frequency source power to energize the plasma. The plasma source power 330 typically has a higher frequency than the plasma bias power 325, such as between 100 and 180 MHz, and in a particular embodiment, is in the 162 MHz band. In particular embodiments the top source operates between 100 W and 5000 W. Bias power more directly affects the bias voltage on substrate 310, controlling ion bombardment of the substrate 310, while source power more directly affects the plasma density.

It is noted that these exemplary power ranges are for processing of a workpiece having a 300 mm diameter (e.g., 12 inch wafer) and power levels can be expected to scale with subsequent generations of the systems so as to maintain at least the same power densities (i.e., watts/unit of substrate area). For example, in an embodiment where the system 300 is configured for 450 mm substrates, the power ranges above are increased by a factor of between 2 and 2.5.

The system component to be temperature controlled by the control system 100 is neither limited to the chuck 320 nor must the temperature controlled component directly couple a plasma power into the process chamber. In an alternative embodiment for example, a showerhead through which a process gas is input into the plasma process chamber is the temperature controlled component. For such showerhead embodiments, the showerhead may or may not be an RF powered electrode. In still other embodiments, the temperature controlled component is a wall liner of the chamber 305 or a process kit composed of one or more of: baffles, shrouds, confinement rings, and bellows, as know in the art.

Referring still to FIG. 1, in embodiments, for the plasma processing system 300, chuck heating power (e.g., to elevate the chuck temperature to 50° C., or more) and chuck cooling power (e.g., to reduce the chuck temperature to 20° C., or below) is provided by a local heat transfer fluid loop 115. The use of a heat transfer fluid loop 115 is particularly advantageous for high bias power densities (kW/workpiece area) embodiments, such as that applicable to dielectric etching where application of 5 kW powers to a 300 mm substrate is not uncommon and RF filtering issues preclude embedding resistive heaters into the chuck 320 (or other temperature controlled component such as a top electrode, etc.).

Embodiments of the present invention include a temperature control system employing both a primary heat transfer fluid loop and a secondary heat transfer loop to thermally couple the temperature controlled component of a plasma processing system to a heat sink or heat source. As employed herein, a primary heat transfer loop is directly coupled to the heat source or heat sink and a secondary heat transfer fluid loop is directly coupled to the temperature controlled component with a primary and secondary loop coupled to each other through an intermediate heat exchanger. For clarity, the secondary heat transfer loop is also referred to herein as a "local" loop, being proximate to the temperature controlled component, while the primary heat transfer loop(s) is(are) referred to herein as "remote" loop(s). One technical advantage of the presently described system is that the local (secondary) loop can be of a short length with minimal fluid volume to increase the system response time to heat load changes (transients). As the intermediate heat exchanger can be relatively smaller than the heat source or sink, control efforts can be applied in close proximity to the control target (i.e., the intermediate heat exchanger may be within a few feet, or less, of the chamber component).

FIG. 1 illustrates an exemplary embodiment where a local heat transfer fluid loop 115 is coupled to a first heat exchanger 112, which is in turn further coupled to a remote heat transfer loop 105 that places the first heat exchanger 112 in fluid communication with a heat sink (e.g., a chiller 377) to remove heat from the chuck 320. As further illustrated, a temperature controller 375 is coupled, either directly, or indirectly (via the controller 370) to one or more actuators 120 operative in the local heat transfer fluid loop 115, or to an actuator in the remote heat transfer loop 105 to modulate heat transfer between the local heat transfer fluid loop 115 and the remote heat transfer loop 105 and affect temperature control of the temperature controlled component (chuck 320). For example, in one embodiment having only one remote heat transfer loop 105, the local heat transfer fluid loop 115 includes a bypass (not depicted) of the first heat exchanger 112 with the actuator apportioning heat transfer fluid flow within the local heat transfer fluid loop 115 between the bypass and the first heat exchanger 112. To affect such apportionment, the temperature controller 375 may acquire the temperature setpoint of the chiller 377, and/or a sensed component temperature output from a temperature sensor 376. In further embodiments, as described elsewhere herein, the temperature controller 375 may further acquire a sensed local heat transfer fluid temperature output from a temperature sensor in the local heat transfer fluid loop 115.

While in the simplest implementation only one remote heat transfer loop and one local heat transfer loop is utilized, the exemplary embodiment employs two remote heat transfer loops: one remote loop thermally coupling the local loop to a heat sink; and a second remote loop thermally coupling the local loop to a heat source. The load may maintain a constant heat transfer fluid flow at all times through flow apportionment between the two heat exchangers to yield superior response time and predictable temperature uniformity where the temperature controlled component is to have a wider operating temperature range or faster response time than is achievable through a system employing a single remote heat transfer fluid loop. For example, in one advantageous embodiment illustrated by FIG. 1, the temperature controller 375 is coupled, either directly, or indirectly (via the controller 370) to the one or more actuators 120 to apportion variable fractions of a constant flow rate in the local heat transfer fluid loop 115 between the heat exchangers 112 and 114 which have local (secondary) sides fluidly coupled in parallel into the local heat transfer loop 115. The heat exchangers 112 and 114 further include remote (primary) sides, the first of which is coupled to the remote heat transfer loop 105 and the second of which is coupled to the remote heat transfer loop 110. The remote heat transfer loop 100 is further coupled to the heater 378 as a heat source.

Figure 2A:
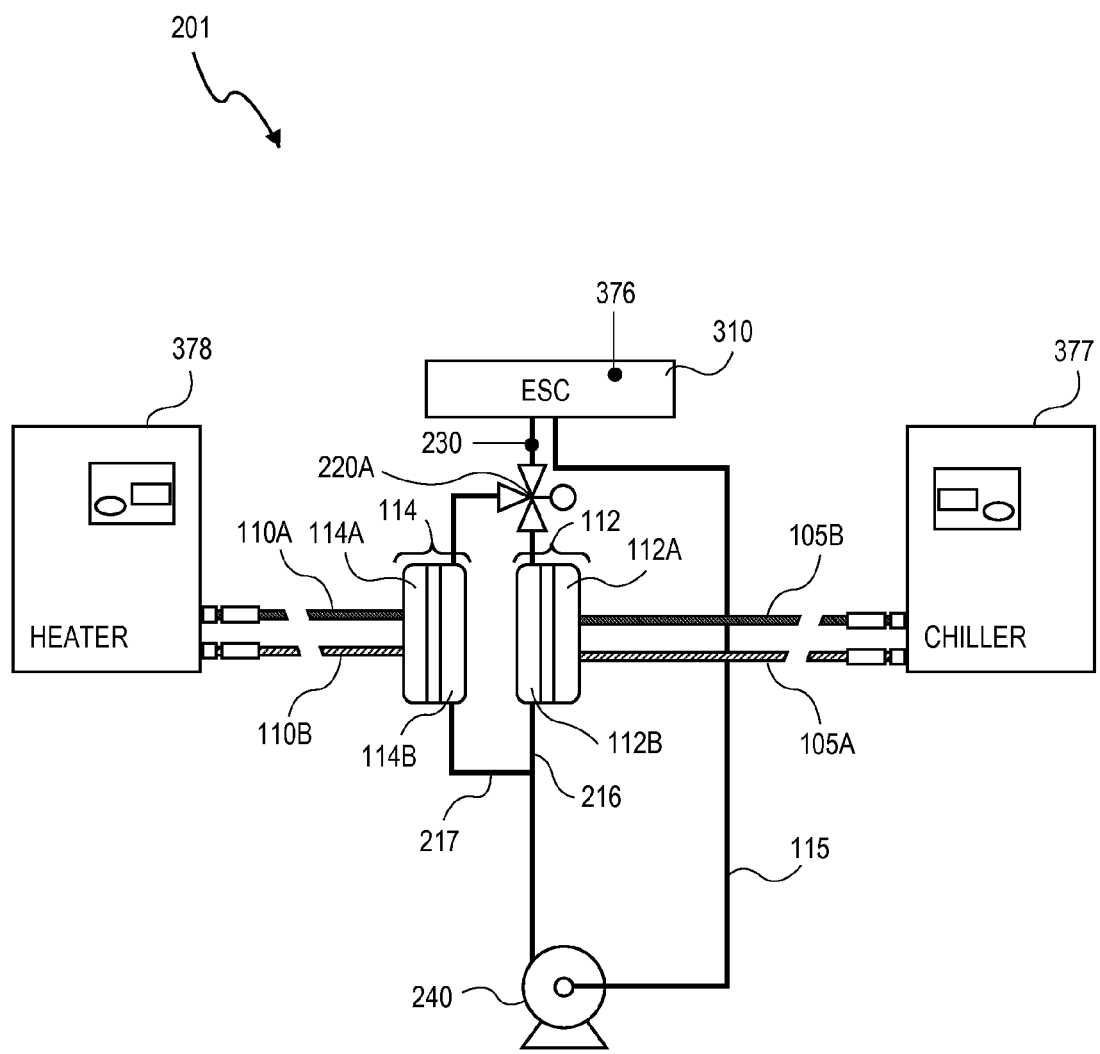
FIG. 2A illustrates a block diagram of hardware in a temperature control system which may be employed in a plasma processing system, in accordance with an embodiment.

FIG. 2A illustrates a block diagram of hardware in a temperature control system 201 which may be employed in a plasma processing system, in accordance with an embodiment. The system 201 further depicts hardware components introduced in the context of FIG. 1. The first remote loop 110 is couples a heater 378 to the heat exchanger 114. Generally, the heater 378 is to operate in any conventional manner to maintain a reservoir of heat transfer liquid at a high temperature setpoint. The high temperature setpoint is generally to be fixed at a constant value for all temperatures at which the control target, the electrostatic chuck (ESC) 320 in the depicted embodiment, is to be operated. In the exemplary embodiment the high temperature setpoint ranges between 80° C. and 120° C. The heat transfer liquid may be any employed in the art, for example a perfluoropolyether known under the trade names of Fluorinert (3M, Inc.) or Galden (Solvey Solexis, Inc), etc. Noting there are different formulations of such heat transfer liquids directed at specific operating temperature ranges, a high temperature formulation with an appropriately high boiling point for the high temperature setpoint may be selected, for example Galden HT200 in the exemplary embodiment where the high temperature setpoint is between 80° C. and 120° C.

The first remote loop 110 includes a supply line 110A and return line 110B coupling the heater 378 to the heat exchanger 114, and more specifically places the heater 378 in fluid communication with a primary side 114A. The heat exchanger 114 may generally be any known in art though smaller form factors (e.g., plate designs) are desirable where the local heat transfer fluid loop 115 is space constrained as it is in the exemplary embodiment where the temperature controlled chamber component is the chuck 320 offering limited external chamber access below a plasma processing chamber where other cabling including RF transmission lines, DC supply lines, sensor lines, and mechanical actuators (e.g., lifts, bellows, etc.) all complete for chamber access. The remote loop lines 110A, 110B may be of any length needed to accommodate space constraints proximate to the chamber component (ESC 320) and facilitation. In the exemplary embodiment, lines 110A and 110B are on the order of 75 feet and of a diameter to accommodate moderate circulation pressures such that fluid volume of the first remote loop 110 may range from 1 to 5 liters while the heat transfer fluid reservoir in the heater 378 typically being 8-10 liters for a total fluid volume of 9-15 liters. This relatively large volume provides a good static heat source.

As further illustrated in FIG. 2A, the second remote heat transfer fluid loop 105 couples the chiller 377 to the heat exchanger 112, and more specifically places the chiller 377 in fluid communication with a primary side 112A. Similar to the heater 378, the chiller 377 may be of any conventional design and manufacture (e.g., commercially available from SMC Corp.) and also is to maintain heat transfer fluid in a reservoir of similar capacity as that of the heater 378 with a pump to circulate the fluid in the loop 105. The loop lines 105A, 105B may again be of any length needed to accommodate space constraints proximate to the chamber component and accommodate facilities. In the exemplary embodiment, lines 105A and 105B are also on the order of 75 feet with a fluid volume of the first remote loop 110 again being in the range of 1 to 5 liters for a total fluid volume of 9-15 liters. While the first and second remote heat transfer fluid loop 105 and 110 are therefore of approximately the same thermal mass, embodiments are not limited in this respect beyond serving as a good static heat source/heat sink.

Because the second remote heat transfer fluid loop 105 is isolated from the first remote heat transfer fluid loop 110, the heat transfer fluid formulation utilized in the second remote heat transfer fluid loop 105 may be optimized for a desired, constant second temperature setpoint (e.g., low temperature), independent from that employed by the first remote heat transfer fluid loop 110. In certain embodiments, multiple remote heat transfer fluid loops employ heat transfer fluids of different composition, with typically different specific gravity, different boiling points, etc. For example, where the first remote heat transfer fluid loop 110 is a heat source employing Galden HT200 for operation in the range of 80° C.-120° C., the second remote heat transfer fluid loop 105 employs Galden HT135 for operation in the range of 0° C.-20° C. (or even a −15° C.-0° C.).

In alternative embodiments, for at least one of the remote heat transfer fluid loops, the heat transfer fluid undergoes a phase change at a temperature of the heat exchanger, at a temperature of the heat source/sink or at a temperature there between. For example, in one embodiment the chiller 377 is replaced with any conventional vapor-compression refrigeration unit thermally coupled to the remote heat transfer fluid loop 105. For such an embodiment, heat is removed at the heat exchanger 112 with direct expansion a constant pressure and temperature phase change of the heat transfer fluid at the primary side 112A. As such, the heat transfer fluid is not necessarily a liquid, but may also be in a gas phase or a vapor. A similar technique may also be employed for remote heat transfer loop 110, though the cycle is reversed with condensation of a hot gas or vapor (e.g., steam, etc.) occurring at the primary side 114A.

The heat exchangers 112, 114 include secondary sides 112B, 114B respectively that are in fluid communication with the local heat transfer fluid loop 115. As shown the local heat transfer fluid loop 115 includes a branch 216 in fluid communication with the heat exchanger secondary side 112B to thermally couple the local heat transfer fluid loop 115 to the second remote heat transfer fluid loop 105. Similarly, the local heat transfer fluid loop 115 includes a branch 217 in fluid communication with the heat exchanger secondary side 114B to thermally couple the local heat transfer fluid loop 115 to the first remote heat transfer fluid loop 110. Because the local heat transfer fluid loop 115 is not in fluid communication with either of the remote heat transfer fluid loops 105, 110, the heat transfer fluid formulation utilized in the local heat transfer fluid loop 115 may also be independently optimized for a desired operating temperature range. For example, in one embodiment the heat transfer fluid employed by the local heat transfer fluid loop 115 is of a different composition than that employed by one or both of the remote heat transfer fluid loops 105, 110. In the exemplary embodiment, the heat transfer fluid is a liquid, such as Galden HT135, HT200, etc. and is circulated via the pump 240. Alternatively, the heat transfer fluid undergoes a phase-change at some point within the local heat transfer fluid loop 115 and so a gas or vapor phase is also contemplated for particular embodiments.

In embodiments, the local heat transfer fluid loop 115 is to be of significantly shorter line length than that of the remote heat transfer fluid loop(s) because the local heat transfer fluid loop 115 is to have a temperature setpoint which is to fluctuate during processing as a process recipe calls for different operating temperatures. With the architecture of the system 201, the local heat transfer fluid loop 115 in essence becomes part of the load that is to be temperature controlled by modulating thermal exposure of the load to the heat sink and source provided by the remote loops 110, 105. This thermal load remains well mixed with a uniform temperature through circulation of the heat transfer fluid with the local loop 115, for example in FIG. 2A, as motivated in a clockwise circulation by the pump 240. Minimal line length therefore advantageously reduces thermal mass of the load, reducing transient response times. With short line lengths, line diameters may also be smaller than those employed in the remote loop lines 110A,B and 105A,B for reduced heat transfer fluid volumes. The local heat transfer fluid loop 115 advantageously has less than half the volume of the first remote loop 110, and preferably no more than 10 to 30% of the remote loop volume. In one exemplary embodiment where a remote loop has total fluid volume of 9-15 liters, the local heat transfer fluid loop 115 has a volume of about 2 liters.

As shown, the branches 216 and 217 couple the secondary sides of the two heat exchangers 114 and 112 in parallel within the local heat transfer fluid loop 115. At least one end of the branches 216 and 217 are coupled together through one or more actuators controllable to apportion the heat transfer fluid circulated within the local heat transfer fluid loop 115 between the heat exchangers 112, 114. In the exemplary embodiment, the actuator is a mixer 220A entailing either set of valves (i.e., a valve manifold with one valve per exchanger) or a multi-way mixing valve with an input side coupled to each of the heat exchangers 112, 114. As shown, the mixer 220A includes three sides, two in fluid communication with outlets of the secondary sides 112B, 114B and the third side being an outlet in fluid communication with the inlet to the ESC 320. Depending on the position of a valve relative to the two input sides in the mixer 220A, between 0 and 100% of a fluid flow through the local heat transfer fluid loop 115 passes through a first of the secondary sides 112B, 114B with the remainder passing through the secondary of the secondary sides. In certain such embodiments, the fluid flow through the local heat transfer fluid loop 115 is maintained at a constant, fixed rate by the pump 240 with only apportionment of that fixed rate varying in response to a control operator's output signal.

In the exemplary embodiment, the mixer 220A coupled to a downstream end of the heat exchangers 112, 114 disposed between the heat exchangers 112, 114 and ESC 320 as the temperature controlled chamber component to place the control actuator as close to the control target as possible. Of course, an alternate embodiment may have the mixer 220A coupled to an upstream end of the heat exchangers, for example to be disposed either between the heat exchangers 112, 114 and the pump 240 or to remain disposed between the heat exchangers 112, 114 and the ESC 320 but with the recirculation direction reversed to be counterclockwise.

In an embodiment, both the chamber component to be controlled and the local heat transfer fluid loop are temperature sensed via separate temperature sensors. As illustrated in FIG. 2A, temperature of the heat transfer fluid in the local loop 115 is sensed with a sensor (e.g., thermocouple) 230 disposed at the outlet of the mixer 220A for immediate feedback to a controller of the mixer 220A. The ESC 320 is similarly sensed with the sensor 376. As described elsewhere herein, temperature control algorithms may employ one or more of these separate temperature sensors.

Figure 2B:
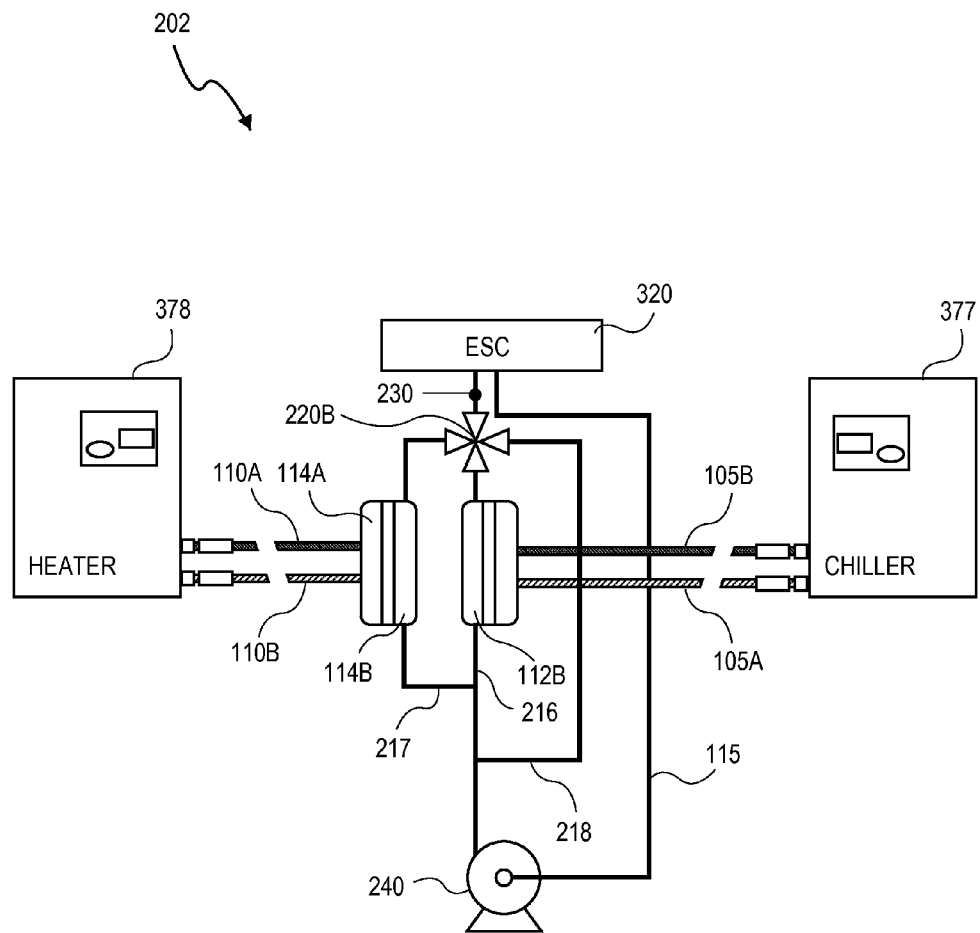
FIG. 2B illustrates a block diagram of hardware in a temperature control system which may be employed in a plasma processing system, in accordance with an embodiment.

FIG. 2B illustrates a block diagram of hardware in a temperature control system 202 which may be employed in a plasma processing system, in accordance with an embodiment. Like the system 201, the system 202 further depicts hardware components introduced in the context of FIG. 1 with like reference numbers applied to those components already described. As shown the system 202 is substantially the same as that of system 201 with the addition of a bypass line 218 enabling the local heat transfer fluid loop 115 to circulate at a constant flow rate while concurrently apportioning 0% of the flow through both the heat exchangers 112, and 114. As such, the branches 217 and 216 may be rendered stagnant for a time. In the system 202, the flow proportioning is between the branches 216, 217 and bypass 218, all in parallel, with flow via a four-way mixer 220B having three inlet sides, each coupled to one of the branches and one outlet side coupled to the ESC 320 (or other temperature controlled chamber component). Advantages of the system 202 over the system 202 include an ability to reduce the thermal load on the system, for example during an idle time of the processing chamber when there is relatively little external perturbation of the system.

Figure 3:
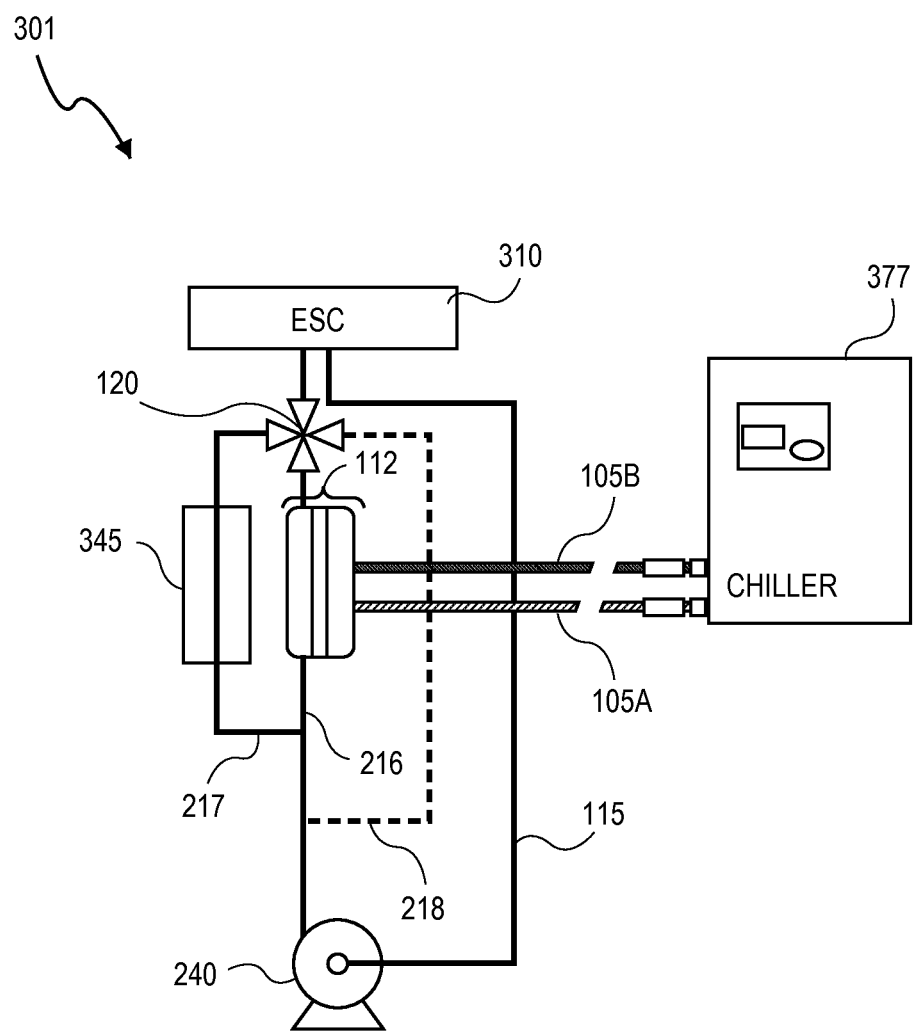
FIG. 3 illustrates a block diagram of hardware in a temperature control system which may be employed in a plasma processing system, in accordance with an embodiment.

In an alternate embodiment, at least one of the heat source and heat sink are provided by a heater or chiller in-situ to local heat transfer fluid loop 115. FIG. 3 illustrates a block diagram of hardware in a temperature control system 301 which may be employed in a plasma processing system, in accordance with such an embodiment. As shown, the first remote heat transfer fluid loop 110 is replaced with an in-situ heater 345 positioned on the local heat transfer fluid branch 217. The in-situ heater 345 may for example be an in-line resistive heater. As with the system 201, the actuator 120 couples the outputs of the in-situ heater 345 and heat exchanger 112 to apportion a constant flow rate with the local loop between the two. As such, the system 301 may be considered intermediate between systems employing only one remote heat transfer loop and those employing two remote heat transfer fluid loops (e.g., 201, 202) to the extent that active heating is applied to the branch 217. However, as most in-line heaters (or chillers) are not capable of power loads as high as those achievable with larger ex-situ systems (e.g., heater 378), the system 301 is best suited for moderate response times and/or moderately low ESC temperatures (e.g., below 30° C.). In one embodiment, in the system 301 the actuator 120 may be implemented with a three-way valve (e.g., like mixer 220A) or equivalent set of 2-way valves mixing two input sides into one outlet side. In another embodiment where the local heat transfer fluid loop 115 includes the bypass 218 (denoted in FIG. 3 with a dashed line), the actuator 120 may be implemented with a four-way valve (e.g., like mixer 220B) or a functionally equivalent set of 2-way valves.

Figure 4:
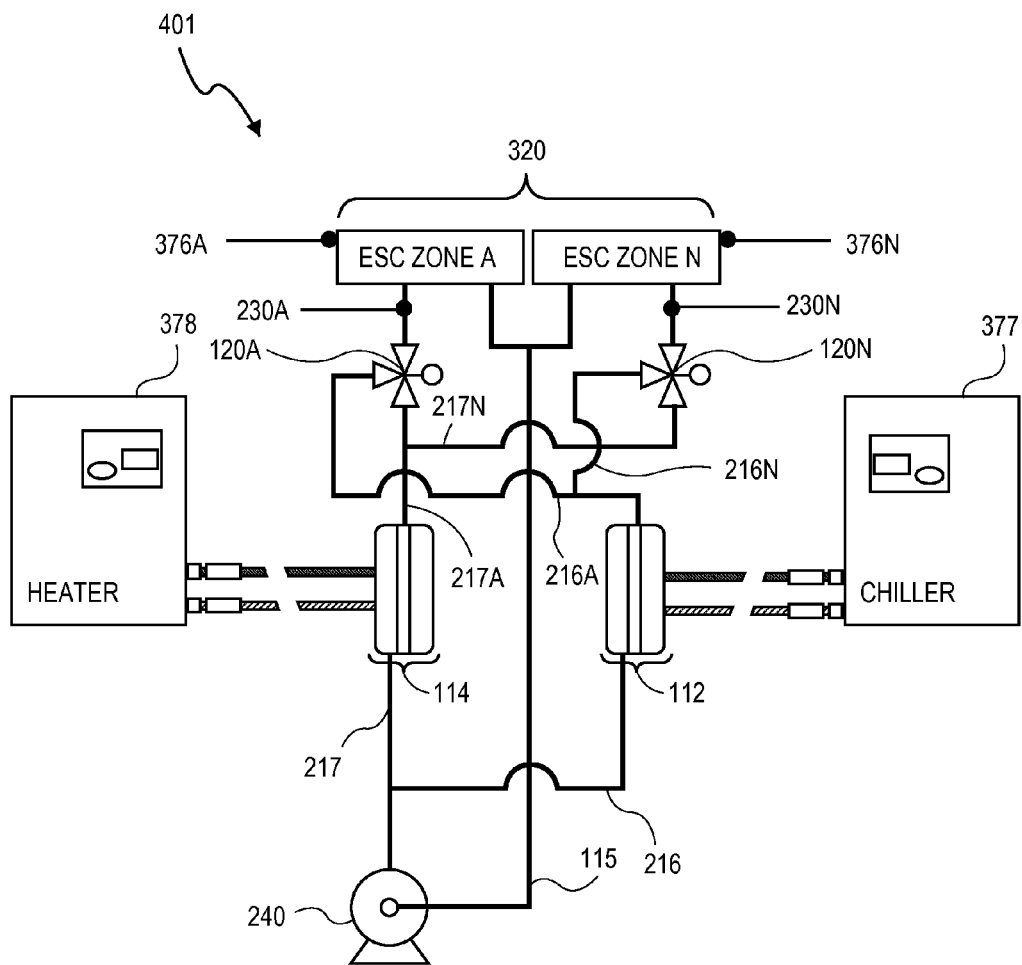
FIG. 4 illustrates a block diagram of hardware in a temperature control system which may be employed in a plasma processing system having multiple temperature control zones, in accordance with an embodiment.

FIG. 4 illustrates a block diagram of hardware in a temperature control system 401 which may be employed in a plasma processing system where a chamber component includes multiple temperature control zones, in accordance with one embodiment. In FIG. 4, the ESC 320 includes a control zone A and a control zone N. While it is contemplated that any of the systems described elsewhere herein may simply be replicated for each control zone present in a multi-zone component, multiplication of the remote loops may be prohibitive on a basis of cost or space constraints. As such, in the exemplary embodiment, a plurality of mixers, one for each control zone are fluidly coupled to each heat exchanger or in-situ source/since present with control of the zones made independent through independent actuation of the mixers.

The ESC zone A has an inlet in fluid communication with a first mixer 120A (e.g., a 3-way mixing valve), that is in parallel fluid communication with a downstream (or upstream) end of each of the first heat exchanger 112 and a second heat exchanger 114 (or inline heater, chiller) via the branches 216A and 217A, respectively. Similarly, the ESC zone N has an inlet in fluid communication with a second mixer 120N (e.g., a second 3-way mixing valve) that is in parallel fluid communication with a downstream (or upstream) end of each of the first heat exchanger 112 and the second heat exchanger 112 (or inline heater, chiller) via the branches 216N and 217N, respectively, which are tapped of the branches 216A and 217A. The thermal zones A-N each include an outlet in fluid communication with the upstream (or downstream) end of each of the first and second heat exchangers 112, 114 (or inline heater, chiller). For example, the outlets from each zone A, N may be joined and returned to supply a low pressure side of the pump 240.

As shown, each zone further includes a independent primary temperature sensor 376A, 376N and an independent second temperature sensor 230A, 230N. Separate control algorithms may be implemented to independently control each mixer 120A through 120N substantially as described elsewhere herein in the context of a single thermal zone. In further embodiments, each mixer may be further coupled to a bypass substantially as described elsewhere herein in the context of a single temperature zone.

Figure 5:
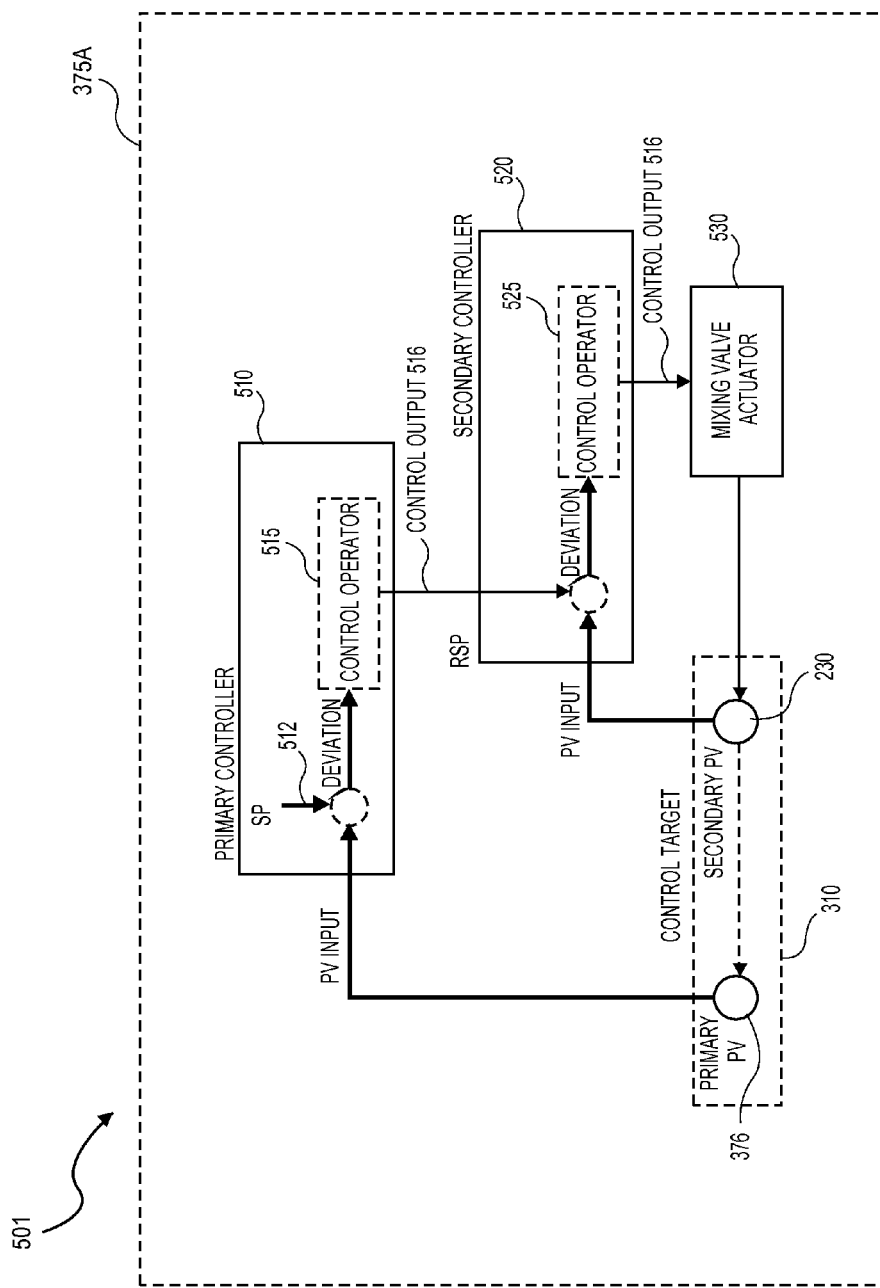
FIG. 5 illustrates a block diagram of a temperature control algorithm which may be employed in the temperature control systems described herein, in accordance with an embodiment.

FIG. 5 illustrates a block diagram of a temperature control algorithm 501 which may be employed in the temperature control systems described herein, in accordance with an embodiment. In the exemplary embodiment, the control algorithm 501, or the like, is implemented by the temperature controller 375, as further illustrated in FIG. 1 during processing of a workpiece.

While any conventional single level control algorithm may be utilized to affect temperature control based on an sensed temperature of the control target (e.g., ESC 320), in the exemplary embodiments where both a temperature of the control target and temperature of heat transfer fluid in the local heat transfer fluid loop are sensed, the control algorithm may have a cascaded control architecture, such as that depicted in FIG. 5.

As illustrated, a primary controller 510 receives as an input a setpoint temperature 512 for the chamber component to which the component is to be controlled. The setpoint temperature 512 for example is defined in a process recipe step within a process recipe filed specifying a sequence of process recipe steps. The primary controller 510 further receives as an input a primary sensed temperature provided by the primary temperature sensor 376. The primary sensed temperature is the actual temperature of the control target. A control operator 515 then output a primary control output 516 to counteract a deviation determined between the setpoint temperature 512 and the primary sensed temperature. Any conventional means of determining a control effort based on this deviation may be utilized (e.g., PID control).

A secondary controller 520 receives as an input the control output 516 and performs a comparison to a secondary sensed temperature provided by the secondary temperature sensor 230. From the resulting deviation, the control operator 525 generates a secondary control output 516 which is output as the basis for driving an actuator 530, such as a mixing valve actuator where a mixing valve is employed. Resulting changes to the system are then fed back through the temperature sensors.

Figure 6:
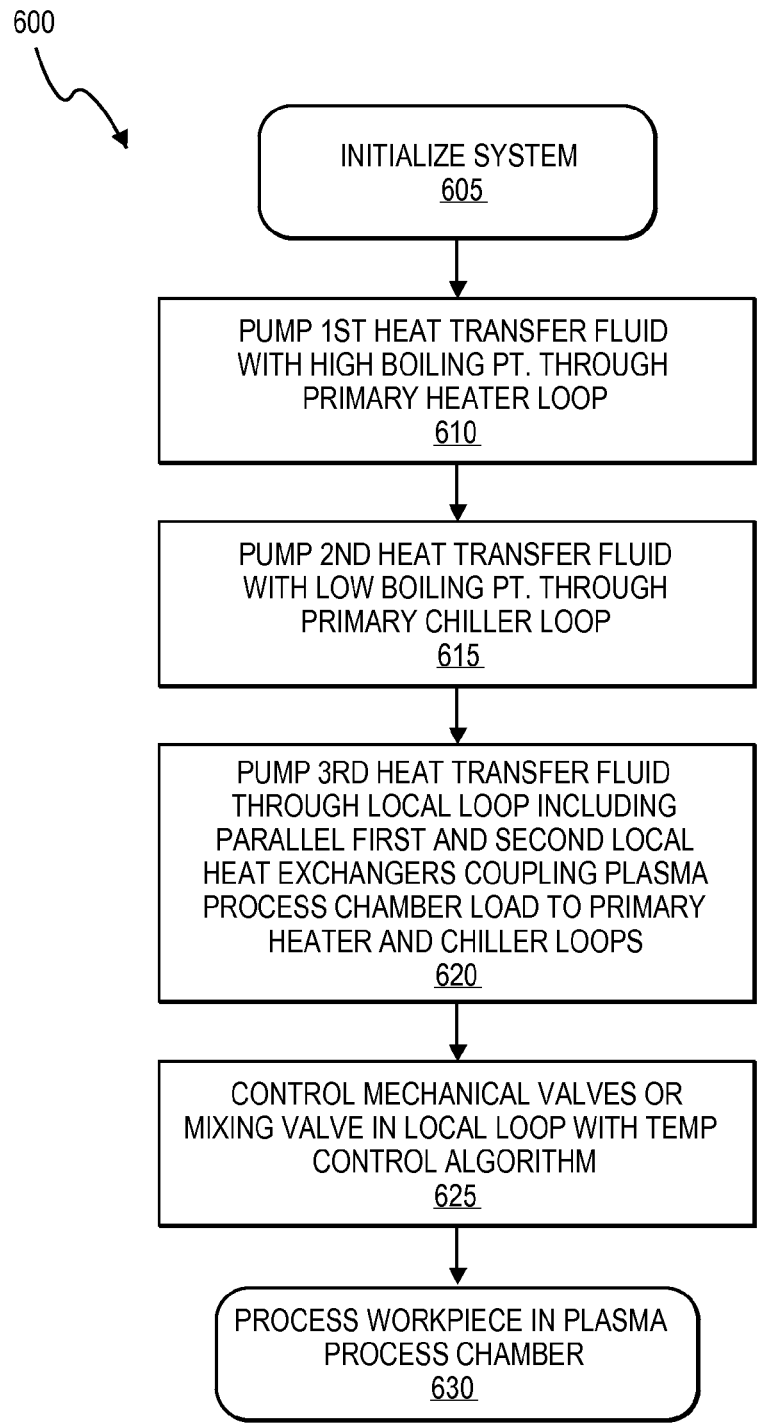
FIG. 6 illustrates a method to operate the temperature control systems described herein, in accordance with an embodiment.

FIG. 6 illustrates a method 600 for operating the temperature control systems described herein, in accordance with an embodiment. After system initialization at operation 605, a first heat transfer fluid, for example having a high boiling point, is pumped through a first primary (remote) heat transfer fluid (heater) loop at operation 610 while a second heat transfer fluid, for example having a low boiling point, is pumped through a second primary (remote) heat transfer fluid (chiller) loop concurrently at operation 615.

At operation 620, a third heat transfer fluid is pumped through a local heat transfer fluid loop that includes for example first and second local heat exchangers thermally coupling the plasma process chamber to the primary heater and chiller loops.

At operation 625, mechanical valves (analog or digital) are actuated based on a control algorithm to vary a flow rate of the third heat transfer fluid between the first and second local heat exchangers. In one embodiment operation 625 further entails sensing a temperature of a chamber component, outputting a primary control signal based on a deviation between the sensed component temperature and a component temperature setpoint, sensing a temperature of the third heat transfer fluid, outputting a secondary control signal based on a deviation between the sensed third heat transfer fluid temperature and the primary control signal, and driving a multi-way valve based on the secondary control signal. Concurrent with operation 625, a workpiece is processed in the plasma processing chamber at operation 630 while the temperature controlled chamber component is controlled to a setpoint temperature.

Figure 7:
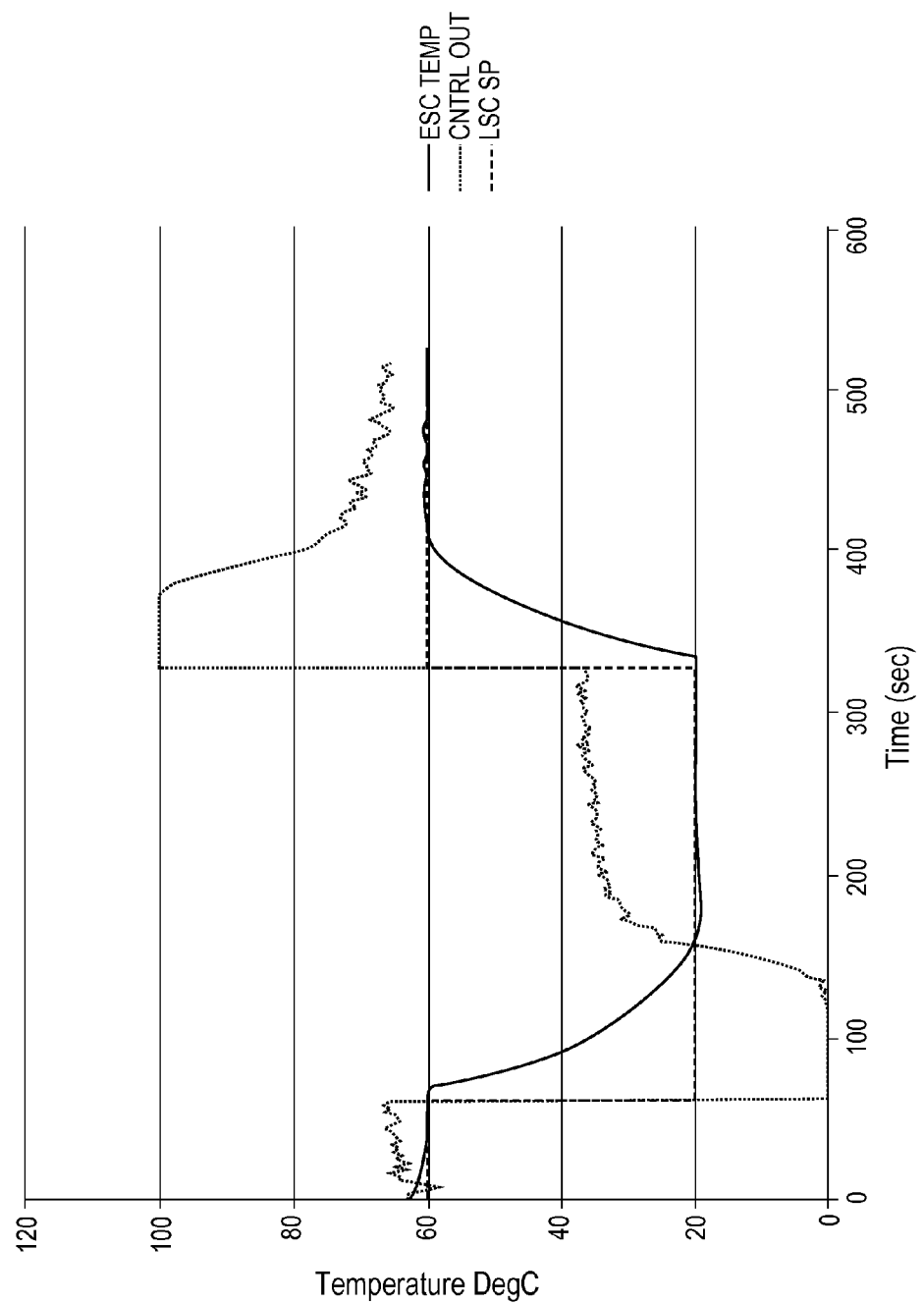
FIG. 7 is a graph illustrating temperature control response times for the temperature control system illustrated in FIG. 2A, in accordance with an embodiment.

FIG. 7 is a graph illustrating temperature control response times for the temperature control system illustrated in FIG. 2A, in accordance with an embodiment. The temperature setpoint for the control target ("ESC SP") is plotted as a function of time (sec). The plot "CONTROL OUT" represents the secondary control output 526 generated by the cascaded control algorithm 501 as a function of time (sec) while a sensed temperature of the control target ("ESC TEMP") is also plotted. As shown, with a change in setpoint from 60° C. to 20° C., the system stabilizes at the new setpoint in less than 90 seconds with similar performance achieved when the setpoint is returned.

In another aspect, in accordance with one or more embodiments of the present invention, a fluid temperature control system used to improve on wafer results by improving the performance of a heated ESC and non-heated assemblies or other chamber components. For example, in one embodiment, a fast response fluid control system is used with an AC heated ESC assembly. The coupling of the two components can improve the temperature response of all contemplated AC heated ESC assemblies.

To provide context, the ability to quickly change the fluid temperature can improve the AC heated ESC step to step response time. The ability to closely track the AC heater setpoint can lower the power required to maintain a given ESC temperature set-point and can improve the total ESC temperature uniformity. In an embodiment, the use of dedicated cooling paths for each heated zone minimizes cross talk between heater zones and improves temperature uniformity of an associated cooling base by managing the heat load from each heater separately. It is to be understood that the fluid control system may be used to improve all parts of the chamber requiring fast temperature control, not just ESC assemblies. In an exemplary embodiment, a temperature control unit (TCU) is used as a point of use temperature control unit, much like any other heat exchanger or chiller. Process gains can be achieved through better temperature stability over an entire recipe (e.g., for high aspect ratio (HAR) type recipes, high input power) or critical dimension (CD) uniformity improvement by local temperature adjustments.

As described in greater detail below, one or more embodiments are targeted to (1) use of a TCU with a multi-zone AC heated ESC (e.g., with single and multiple zone heaters and/or with single and multiple zone cooling base, (2) use of a TCE with a variable flow pump option (e.g., to allow for low energy idle state operations), and/or (3) use of a TCE with cooling base modifications specifically design to improve the ESC assembly performance with a fluid control system (e.g., for mass reduction of entire assembly and/or cooling channel heat transfer optimization and/or dedicated cooling channel per heater zone and/or thermal interface optimization between ceramic and cooling base such as metal bonding or other high thermal conductivity interface material).

Figure 8:
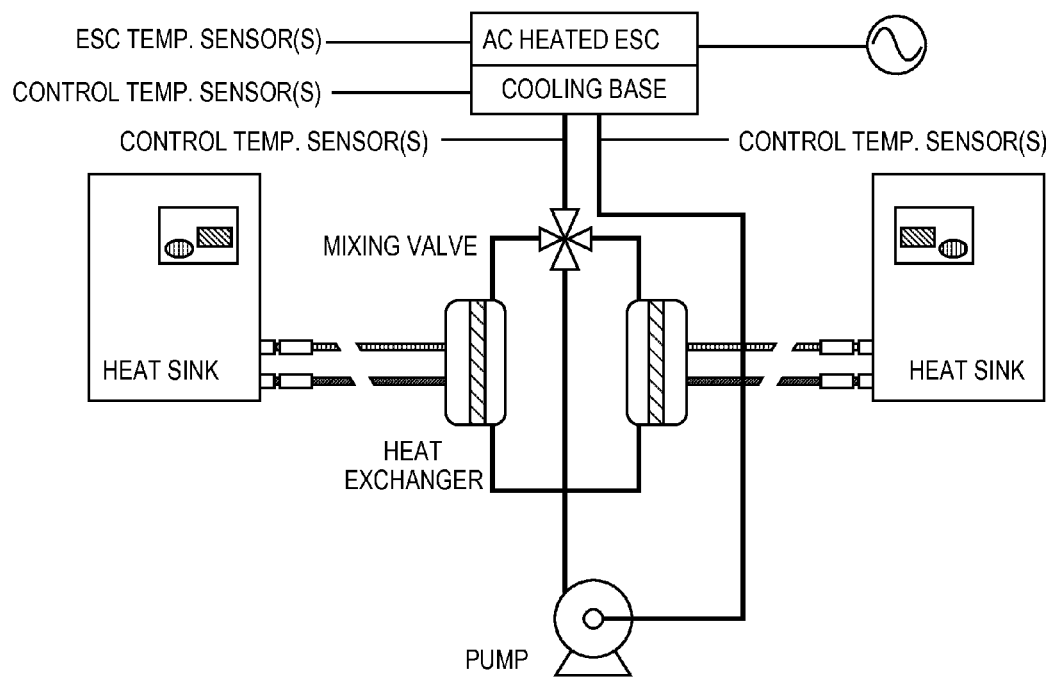
FIG. 8 is a schematic of a temperature control (TCU) for use with a general load, in accordance with an embodiment of the present invention.

In a first exemplary embodiment, FIG. 8 is a schematic of a temperature control (TCU) for use with a general load, in accordance with an embodiment of the present invention. Referring to FIG. 8, a TCU is provided in general form. The TCU can be used with any load (e.g., chamber part) requiring fluid temp control. In one such embodiment, a TCE is used in conjunction with one or more of a showerhead, a baffle, wall liners, a chamber body, or any part that uses fluid temperature control. Supply or return temperature control of fluid can be effected with or without load temperature control.

Figure 9:
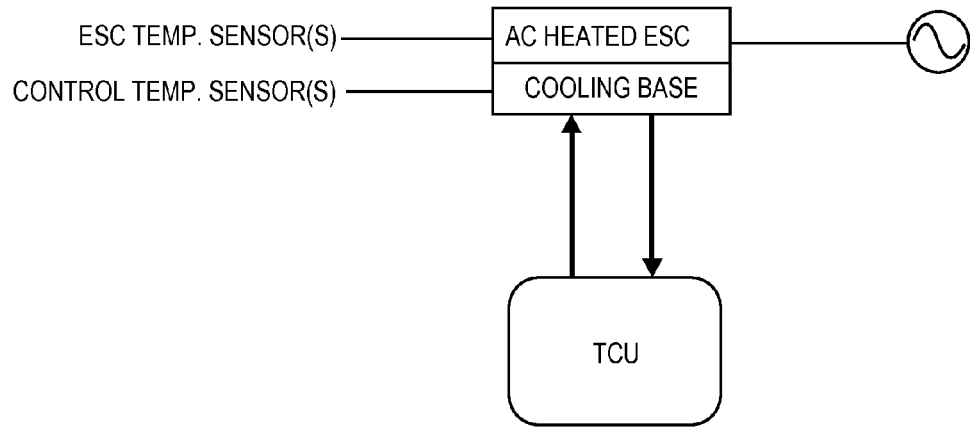
FIG. 9 is a schematic of an AC heated electrostatic chuck (ESC), in accordance with an embodiment of the present invention.

In a second exemplary embodiment, FIG. 9 is a schematic of an AC heated electrostatic chuck (ESC), in accordance with an embodiment of the present invention. Referring to FIG. 9, a TCU is provided with an AC heated ESC. TCU use may be performed or configured with a single cooling base and single or multi-zone AC heated ESC. Such arrangements may be used to optimize temperature uniformity of a heated ESC by allowing heaters to be run at a lowest power level necessary to achieve temperature set-point. In an embodiment, primary (mean) temperature control is performed by a fluid control system, and heaters are used for small localized adjustments of temperature required to accommodate plasma heat load non-uniformity.

Figure 10:
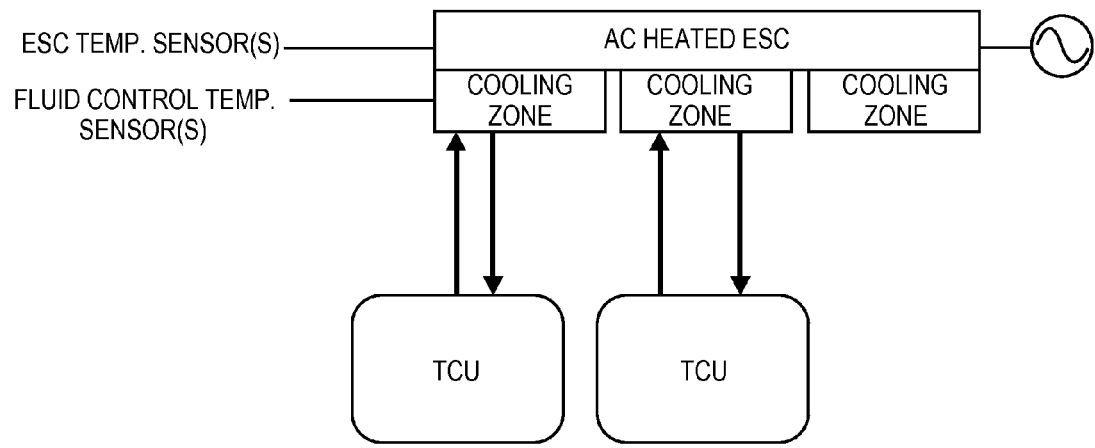
FIG. 10 is a schematic of a temperature control (TCU) for use with multiple zone cooling base and single or multiple zone AC heated electrostatic chuck (ESC), in accordance with an embodiment of the present invention.

In a third exemplary embodiment, FIG. 10 is a schematic of a temperature control (TCU) for use with multiple zone cooling base and single or multiple zone AC heated electrostatic chuck (ESC), in accordance with an embodiment of the present invention. Referring to FIG. 10, a TCU is used with a multiple zone cooling base option. A cooling base zone is added to complement each individual heater zone in ESC or combinations. In one such embodiment, a dedicated cooling zone is added to outer edge heater zone(s) only for enhanced edge temperature control performance. Cooling zones can be concentric for azimuthal symmetry or distributed for local control.

Figure 11:
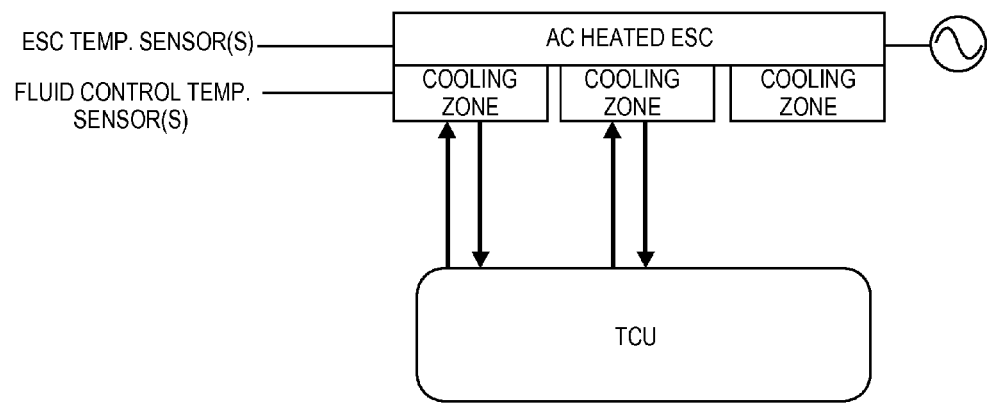
FIG. 11 is a schematic of a temperature control (TCU) for use with a multiple zone cooling base, in accordance with an embodiment of the present invention.

In a fourth exemplary embodiment, FIG. 11 is a schematic of a temperature control (TCU) for use with a multiple zone cooling base, in accordance with an embodiment of the present invention. Referring to FIG. 11, a TCU is used with a multiple zone cooling base. Some attributes may be similar to those discussed in association with FIG. 10, but here a single TCU is used with multiple control valves. Such an arrangement can allow for a greater degree of mean temperature control by a fluid control system.

Figure 12:
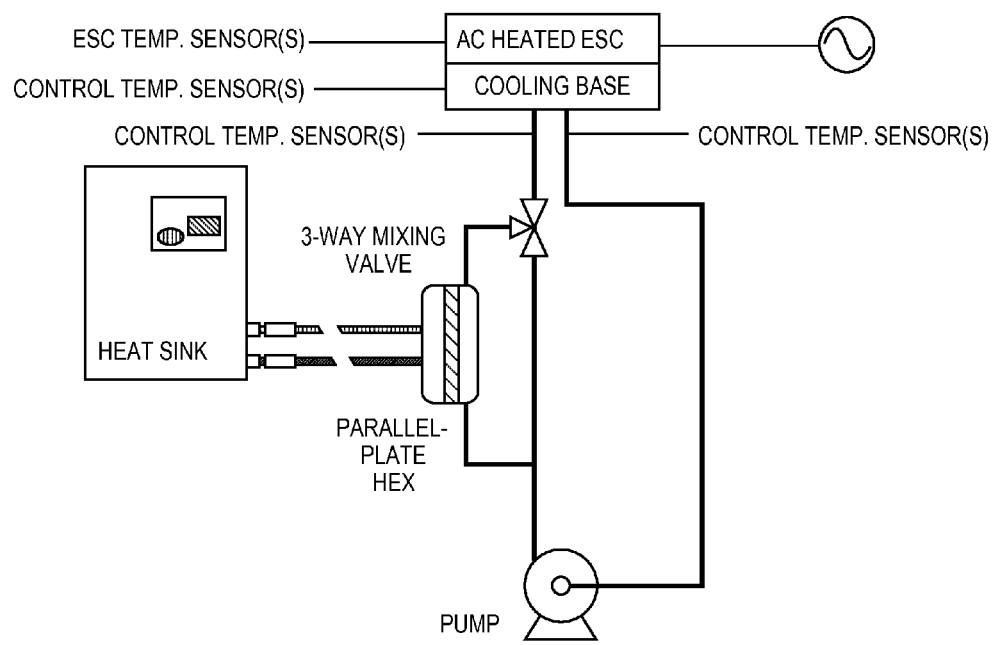
FIG. 12 is a schematic of an alternative form of a temperature control (TCU) for use with a heated electrostatic chuck (ESC), in accordance with an embodiment of the present invention.

In a fifth exemplary embodiment, FIG. 12 is a schematic of an alternative form of a temperature control (TCU) for use with a heated electrostatic chuck (ESC), in accordance with an embodiment of the present invention. Referring to FIG. 12, a TCU is provided in an alternative form for use with a heated ESC. The arrangement involves utilizing heating capacity of the AC heaters in ESC for fluid temperature control, eliminating heating half of TCU. Embodiments can include the use of multiple valves and feedback for multi-zone heater and cooling base just like TCU.

Figure 13:
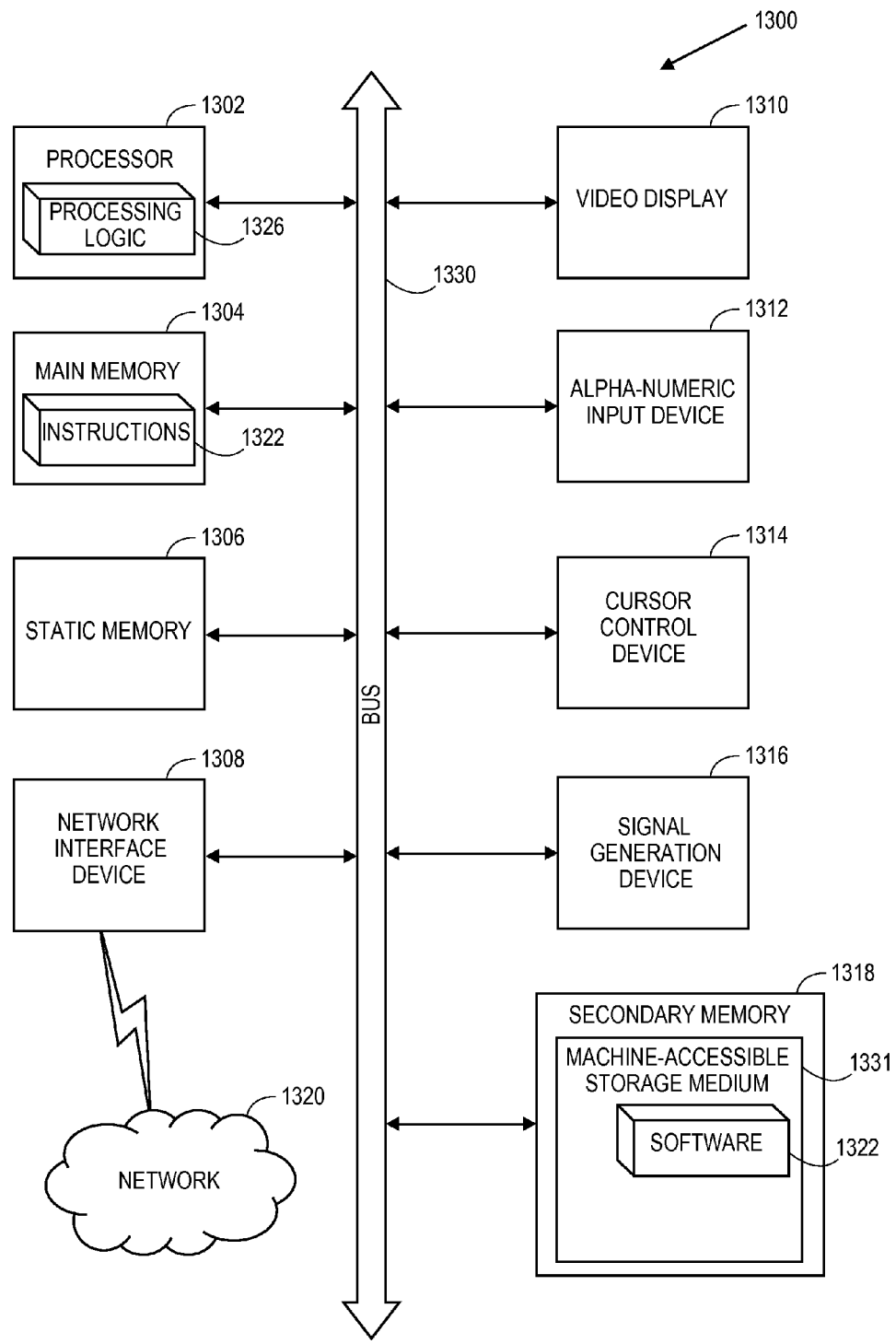
FIG. 13 illustrates a block diagram of an exemplary computer system, in accordance with one embodiment of the present invention.

FIG. 13 illustrates a diagrammatic representation of a machine in the exemplary form of a computer system 1300 which may be utilized to perform the valve control operations described herein (e.g., to execute the method 600 and/or algorithm 501). In one embodiment, the computer system 1300 may be provisioned as a controller in etch systems or for temperature control units (TCUs) described herein. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies discussed herein.

The exemplary computer system 1300 includes a processor 1302, a main memory 1304 (e.g., read-only memory (ROM), flash memory, dynamic random access memory (DRAM) such as synchronous DRAM (SDRAM) or Rambus DRAM (RDRAM), etc.), a static memory 1306 (e.g., flash memory, static random access memory (SRAM), etc.), and a secondary memory 1318 (e.g., a data storage device), which communicate with each other via a bus 1330.

The processor 1302 represents one or more general-purpose processing devices such as a microprocessor, central processing unit, or the like. The processor 1302 may also be one or more special-purpose processing devices such as an application specific integrated circuit (ASIC), a field programmable gate array (FPGA), a digital signal processor (DSP), network processor, or the like. The processor 1302 is configured to execute the processing logic 1326 for performing the valve control operations discussed elsewhere herein.

The computer system 1300 may further include a network interface device 1308. The computer system 1300 also may include a video display unit 1310 (e.g., a liquid crystal display (LCD) or a cathode ray tube (CRT)), an alphanumeric input device 1312 (e.g., a keyboard), a cursor control device 1314 (e.g., a mouse), and a signal generation device 1316 (e.g., a speaker).

The secondary memory 1318 may include a machine-accessible storage medium (or more specifically a computer-readable storage medium) 1331 on which is stored one or more sets of instructions (e.g., software 1322) embodying any one or more of the valve control algorithms described herein. The software 1322 may also reside, completely or at least partially, within the main memory 1304 and/or within the processor 1302 during execution thereof by the computer system 1300, the main memory 1304 and the processor 1302 also constituting machine-readable storage media. The software 1322 may further be transmitted or received over a network 1320 via the network interface device 1308.

The machine-accessible storage medium 1331 may further be used to store a set of instructions for execution by a processing system and that cause the system to perform any one or more of the methods described herein. Embodiments of the present invention may further be provided as a computer program product, or software, that may include a machine-readable medium having stored thereon instructions, which may be used to program a computer system (or other electronic devices) to control a plasma processing chamber temperature according to embodiments of the present invention as described elsewhere herein. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, and other such non-transitory storage media.

It is to be understood that the above description is intended to be illustrative, and not restrictive. For example, while flow diagrams in the figures show a particular order of operations performed by certain embodiments of the invention, it should be understood that such order is not required (e.g., alternative embodiments may perform the operations in a different order, combine certain operations, overlap certain operations, etc.). Furthermore, many other embodiments will be apparent to those of skill in the art upon reading and understanding the above description. Although the present invention has been described with reference to specific exemplary embodiments, it will be recognized that the invention is not limited to the embodiments described, but can be practiced with modification and alteration within the spirit and scope of the appended claims. The scope of the invention should, therefore, be determined with reference to the appended claims, along with the full scope of equivalents to which such claims are entitled.

What is claimed is:

1. A method of controlling a temperature of a component in a plasma processing apparatus, the method comprising:
   providing a first heat transfer fluid at a first temperature to a first heat exchanger;
   providing a second heat transfer fluid at a second temperature to a second heat exchanger;
   controlling a temperature of a third heat transfer fluid by apportioning a rate of flow of the third heat transfer fluid between the first and second heat exchangers, wherein the third heat transfer fluid is not in fluid communication with the first heat transfer fluid, and the third heat transfer fluid is not in fluid communication with the second heat transfer fluid, and wherein the third heat transfer fluid is of a different composition than one or both of the first heat transfer fluid and the second heat transfer fluid;
   providing the third heat transfer fluid to the component; and
   controlling a temperature of an AC heated electrostatic chuck (ESC) assembly.

2. The method of claim 1, wherein providing the first heat transfer fluid comprises using a variable flow pump.

3. The method of claim 1, wherein providing the second heat transfer fluid comprises using a variable flow pump.

4. The method of claim 1, wherein providing the third heat transfer fluid comprises using a variable flow pump.

5. The method of claim 1, wherein the AC heated ESC assembly is a multi-zone AC heated ESC assembly.

6. The method of claim 1, wherein the AC heated ESC assembly comprises a cooling base.

7. A non-transitory machine-accessible storage medium having instructions stored thereon which cause a data processing system to perform a method of controlling a temperature of a component in a plasma processing apparatus, the method comprising:
   providing a first heat transfer fluid at a first temperature to a first heat exchanger;
   providing a second heat transfer fluid at a second temperature to a second heat exchanger;
   controlling a temperature of a third heat transfer fluid by apportioning a rate of flow of the third heat transfer fluid between the first and second heat exchangers, wherein the third heat transfer fluid is not in fluid communication with the first heat transfer fluid, and the third heat transfer fluid is not in fluid communication with the second heat transfer fluid, and wherein the third heat transfer fluid is of a different composition than one or both of the first heat transfer fluid and the second heat transfer fluid;
   providing the third heat transfer fluid to the component; and
   controlling a temperature of an AC heated electrostatic chuck (ESC) assembly.

8. The non-transitory machine-accessible storage medium of claim 7, wherein providing the first heat transfer fluid comprises using a variable flow pump.

9. The non-transitory machine-accessible storage medium of claim 7, wherein providing the second heat transfer fluid comprises using a variable flow pump.

10. The non-transitory machine-accessible storage medium of claim 7, wherein providing the third heat transfer fluid comprises using a variable flow pump.

11. The non-transitory machine-accessible storage medium of claim 7, wherein the AC heated ESC assembly is a multi-zone AC heated ESC assembly.

12. The non-transitory machine-accessible storage medium of claim 7, wherein the AC heated ESC assembly comprises a cooling base.

* * * * *